US006218839B1

(12) United States Patent
Shaikh et al.

(10) Patent No.: US 6,218,839 B1
(45) Date of Patent: Apr. 17, 2001

(54) MAGNETIC RESONANCE IMAGING SYSTEMS

(75) Inventors: Abdulbasad Shaikh, Greenford; Jeremy Francis Williams, North Leigh; Cheng Ni, Coventry, all of (GB)

(73) Assignee: Oxford Magnet Technology Limited, Oxford (GB)

( * ) Notice: Subject to any disclaimer, the term of this patent is extended or adjusted under 35 U.S.C. 154(b) by 0 days.

(21) Appl. No.: 09/317,425

(22) Filed: May 24, 1999

(30) Foreign Application Priority Data

May 22, 1998 (GB) .................................................. 9810976

(51) Int. Cl.$^7$ ....................................................... G01V 3/00
(52) U.S. Cl. ............................................. 324/320; 324/319
(58) Field of Search ..................................... 324/320, 319, 324/318, 300, 314, 307, 309; 335/299, 216

(56) References Cited

U.S. PATENT DOCUMENTS

| 4,631,481 | * | 12/1986 | Young et al. | 324/320 |
| 4,803,433 | | 2/1989 | McBride | 324/318 |
| 4,853,663 | | 8/1989 | Vermilyea | 335/301 |
| 5,389,909 | * | 2/1995 | Havens | 335/216 |
| 5,485,088 | | 1/1996 | Westphal et al. | 324/320 |
| 5,708,360 | * | 1/1998 | Yui et al. | 324/318 |

FOREIGN PATENT DOCUMENTS 2 267 350   12/1993  (GB) .
2 319 339    5/1998  (GB) .

* cited by examiner

*Primary Examiner*—Louis Arana
(74) *Attorney, Agent, or Firm*—Evenson, McKeown, Edwards & Lenahan, P.L.L.C.

(57) ABSTRACT

A magnetic resonance imaging system comprises a magnet (30) for generating a main magnetic field, a gradient coil (34) to superimpose a linearly varying magnetic field over the main magnetic field, and an RF coil (34) forming part of a transmit/receive system for signals which are used to construct an image. A shimset (32) is positioned between the magnet (30) and the gradient coil (34) to provide magnetic field correction and is constructed so as not to have axial and azimuthal symmetry. This is achieved by providing cutout portions (38) in the shimset (32) which are diametrically opposite each other, similar cutouts (40) being provided in the gradient coil (34) which are aligned with the cutout portions (38). The cutout portions (38, 40) accommodate the shoulders of larger patients, therefore reducing the need to extend the bore size of the magnetic resonance imaging system.

8 Claims, 2 Drawing Sheets

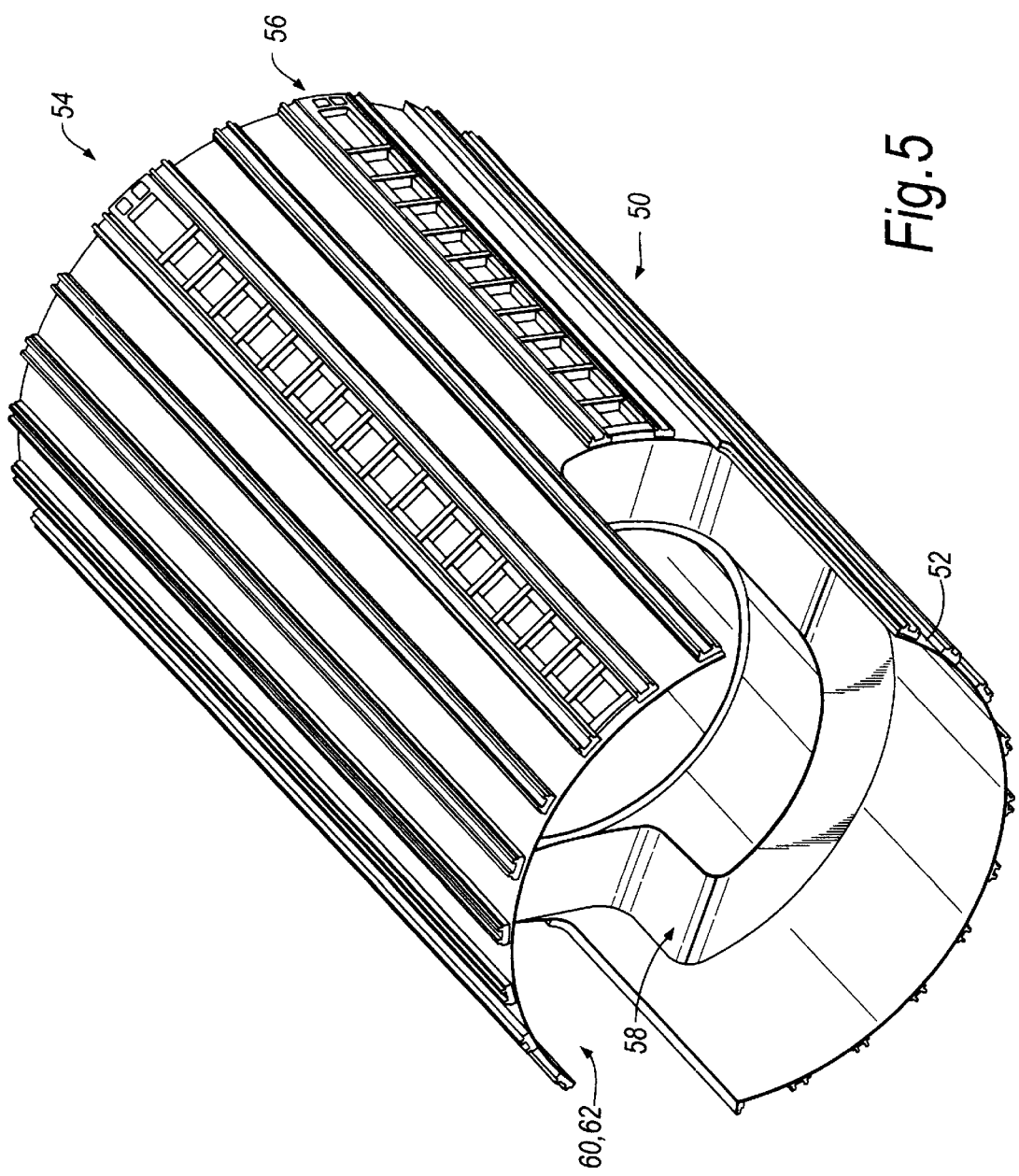

MAGNETIC RESONANCE IMAGING SYSTEMS

BACKGROUND OF THE INVENTION

The present invention relates to improvements in or relating to magnetic resonance imaging (MRI) systems, and is more particularly concerned with the construction of shimming apparatus for use therewith.

A MRI system consists of a magnet which provides a main magnetic field, a gradient coil to superimpose a linearly varying field over the main field, and an RF coil transmit/receive system which is used to receive the signals that are used to construct the image. A good base homogeneity of the main magnetic field in the system is essential for producing good quality images, and hence the process of shimming has been developed in order to establish good base homogeneity.

Shimming is the process by which the field in an MRI magnet is corrected. It is an essential activity, without which the system cannot function. Correction of magnetic field deviations can be performed using any elements that produce a magnetic field. Thus, current carrying conductors, soft iron in the presence of a magnetic field, and permanent magnets have been known to be used. For MRI magnets, passive shimming is extensively used. Passive shimming is defined as the use of magnetic material elements, be they soft iron or permanent magnets, for the correction of magnetic fields. The use of passive shimming is extensive because it is simple, cheap and can achieve high levels of homogeneity.

Passive shimming requires the placing of magnetic material in one or more positions around the bore of a magnet in order to perform the field correction. Traditionally, the process takes the form of a field map of the region of interest, normally defined as a spherical volume. The field values are then decomposed into, as is well known in the art, spherical harmonics, which describe the field variation over the volume. Thus, two elements are required to effect passive shimming, namely, the software which is used to predict the positions of the pieces of magnetic material necessary to perform the field correction, and the hardware, called the shimset, comprising pieces of magnetic material which are appropriately positioned to effect the field correction.

For normal coil wound magnets (also known as solenoidal magnets), the shimset is no more than the hardware needed to locate the precise distribution of magnetic material used to correct inhomegeneities in the magnetic field. In practice, one or more trays are distributed azimuthally over the shimset, each tray having a series of pockets in which shim iron can be placed. The quantity of shim iron in each pocket depends on the inhomogeneity of the magnetic field. Axial and azimuthal symmetry have traditionally been used in the design of shimsets and there has been no need to deviate from that.

SUMMARY OF THE INVENTION

An aim of the present invention is to provide an MRI system which does not require axial and azimuthal symmetry in the shimming.

According to one aspect of the present invention, there is provided a shimset for a magnetic resonance imaging system characterised in that the shimset does not have axial and azimuthal symmetry.

Advantageously, the shimset has a gradient coil which does not have axial and azimuthal symmetry associated therewith.

At least one cutout portion is formed in the shimset. However, it is normal to have two cutout portions which are diametrically opposite each other.

Naturally, the gradient coil includes at least one cutout portion which matches said at least one cutout portion in the shimset.

According to another aspect of the present invention, there is provided a magnetic resonance imaging system comprising a magnet for generating a main magnetic field, a shimset for homogenising the main magnetic field, a gradient coil for superimposing a linearly varying magnetic field over the main magnetic field, and an RF coil forming part of a transmit/receive system for signals which are used to construct an image, characterised in that the shimset and the gradient coil are constructed so as not to have axial and azimuthal symmetry.

In this system, the shimset and the gradient coil each have at least one cutout portion. It is preferred that the shimset and the gradient coil each have two cutout portions which are diametrically opposite each other, the cutout portions of the gradient coil being aligned with the cutout portions of the shimset means.

The MRI system according to the present invention has the advantage of accommodating larger patients without the need to increase the bore size of the magnet because the cutout portions provided accommodate the shoulders of larger patients.

For a better understanding of the present invention, reference will now be made, by way of example only, to the accompanying drawings in which:

BRIEF DESCRIPTION OF THE DRAWINGS

FIG. 5 shows an isometric view of part of an MRI system according to the present invention.

DETAILED DESCRIPTION OF THE DRAWINGS

Figure 1:
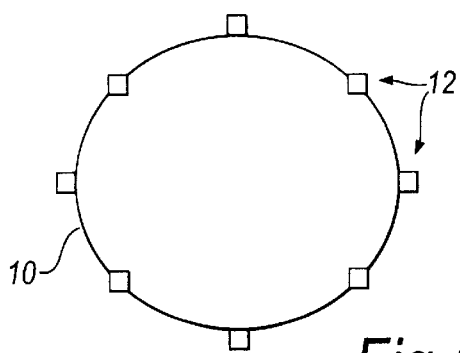
FIG. 1 shows the distribution of shim trays within an MRI system.
Figure 2:
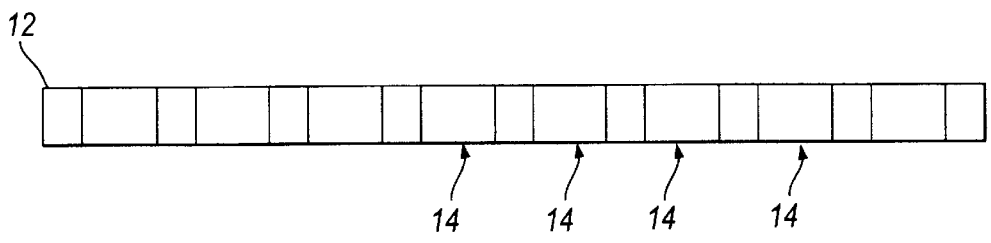
FIG. 2 shows a shim tray.

FIG. 1 illustrates a shimset 10 for a magnet (not shown) around which a plurality of shim trays 12 are distributed azimuthally. A shim tray 12 is shown in FIG. 2. As shown each tray 12 has a series of pockets 14 in which shim iron can be placed. The quantity of shim iron placed in each pocket 14 depends on the inhomogeneity of the magnetic field.

Figure 3:
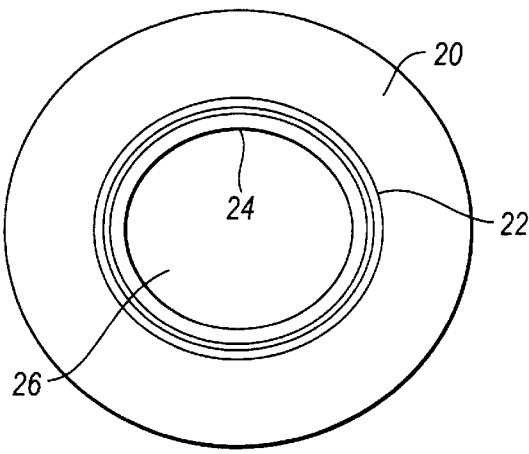
FIG. 3 is a cross-section of a known MRI system.

FIG. 3 shows the normal structure of a known MRI magnet 20. The magnet 20 includes a shimset 22, and a gradient coil 24 as shown. The shimset 22 takes the form as shown in FIGS. 1 and 2. In use, a patient lies within bore 26 of the MRI system and within the magnet 20. Therefore, the size of the bore 26 determines the maximum size of the patient which can be accommodated within the magnet 20 because the shoulders of the patient have to fit within the bore 26.

The cost of MRI systems depends upon the physical size of the system. To accommodate larger patients by providing a larger bore would increase the physical size of the MRI systems and hence the cost.

Figure 4:
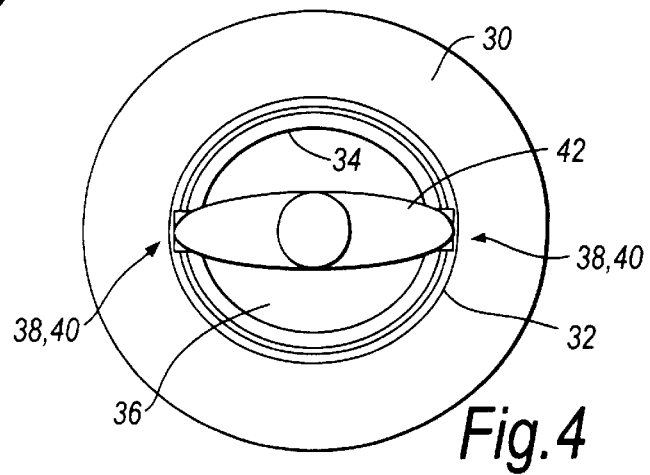
FIG. 4 shows a cross-section of an MRI system according to the present invention.

This problem is overcome by the provision of an MRI system as shown in FIG. 4 which comprises a magnet 30, a shimset 32, a gradient coil 34 and a bore 36. The shimset 32 has a pair of diametrically opposed cutout portions 38. Similar cutout portions 40 are provided in the gradient coil 34 and are aligned with the cutout portions 38 in the shimset 32. This means that a larger patient 42 can be accommodated in the bore 36 by utilising the cutout portions 38, 40 to accommodate the shoulders of the patient 42.

Therefore, the shimset 32 and the gradient coil 34 are constructed so that they do not have axial and azimuthal symmetry.

An isometric view of a part 50 of an MR system according to the present invention is shown in FIG. 5. The part 50 comprises a shimset 52 having a plurality of shim trays arranged around its periphery, only two shim trays 54, 56 being shown for clarity, and a gradient coil 58. In accordance with the present invention, each of the shimset 52 and the gradient coil 58 has similar cutout portions 60, 62 aligned with one another.

By using cutouts and being able to effect passive shimming with the presence of cutouts, the need to increase the bore size of the magnet has been eliminated. This provides an MRI system in accordance the present invention with a competitive advantage, both in terms of price and size as any increase in size will demand a longer magnet and more wire, thereby increasing the cost of the system.

As shown in FIG. 5, it is not necessary for the cutout portions 60, 62 to extend the entire length of the magnet system. The actual length of the cutout is defined by the particular application and may extend along a substantial part of the length of the magnet or even the entire length thereof.

The embodiments described above illustrate the use of two cutouts. However, there is no reason to limit the design to two cutouts if the application requires a different number of cutouts. For example, it may desired to have a single cutout and to have the patient offset with respect to the longitudinal axis of the bore.

The shimset which is to be used with the magnet described with reference to FIG. 4 may be determined as follows:

A complete shimset is designed without cutouts. Hence axial and azimuthal symmetry is assumed. This enables the optimal design for shimming harmonics which are either inherent or due to build errors thereby providing the most suitable distribution of trays and pockets as described above.

The next step is to determine whether the cutouts will cause any degradation in the shimmed homogeneity. This can be achieved by determining the pockets which would not be available as a result of the cutouts and performing the analysis as above with those specific pockets removed from the optimisation process. In this way, the effect of the cutout can be evaluated.

The optimisation process requires the minimisation of a merit function which is indicative of the homogeneity of the magnetic field. The merit function ($\phi$) used is the weighted sum of the squares of the harmonics and can be expressed as:

$$\phi = \sum_{i=1}^{N} \sum_{j=1}^{i} W_{ij}\left(A_i^{j2} + B_i^{j2}\right)$$

where $W_{ij}$ is the weight and $A_i^j$ and $B_i^j$ are the harmonics.

The weights are appropriately selected so that the important harmonics are weighted more than the unimportant ones. The use of harmonics is important because the inadequacy of shim design will be reflected in the remnant harmonics. The shimming capability is evaluated by shimming theoretical data plots generated from a host of harmonics that are typical and atypical of the magnet.

In a specific application in accordance with the present invention, the shimset consisted of 24 trays each having 17 pockets. The pockets in each tray had a depth of about 6 mm enabling a maximum stack height of 6 mm of iron to be placed in each pocket. The trays were placed on a diameter of about 590 mm and the full length of the shimset was 890 mm. The depth of the cutouts was 355 mm. It will readily be appreciated that the asymmetry was significant. The shimset was used to shim a magnet from about 346 ppm (parts per million) down to less than 1 ppm on a spherical volume of diameter 22 cm.

For the above example, the harmonic combination was such at the mass of iron required to shim the magnet was about 10 per cent higher than the case where there are no cutouts. However, the maximum stack height installed increased by about 25 per cent.

Because of the inability to place the iron in the region of the cutout, the optimisation results in increased mass and stack height in other pockets. Thus the penalty incurred as a consequence of employing cutouts is more iron and greater stack heights in the pockets.

As mentioned above, the design process can be applied to any number of cutouts, though that will naturally limit the harmonics that can be shimmed out. Also, the design process can accommodate cutouts of different lengths, and full length cutouts.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A shimset for a magnetic resonance imaging system wherein:

the shimset is axially and radially asymmetric;

the shimset includes at least one cutout portion formed therein for accommodating a patient's shoulders;

the cutout portion contains no shims; and shims of said shimset outside the at least one cutout portion are adapted to compensate for absence of shims in the cutout portion.

2. A shimset according to claim 1, having a gradient coil (34) which does not have axial and azimuthal symmetry associated therewith.

3. A shimset according to claim 1, wherein said shimset has two cutout portions which are diametrically opposite each other.

4. A shimset according to claim 1, further comprising a gradient coil includes at least one cutout portion which matches said at least one cutout portion in the shimset.

5. A magnetic resonance imaging system comprising a magnet for generating a main magnetic field, a shimset for homogenizing the main magnetic field, a gradient coil for superimposing a linearly varying magnetic field over the main magnetic field, and an RF coil forming part of a transmit/receive system for signals which are used to construct an image, wherein:

the shimset is axially and radially asymmetric;

the shimset includes at least one cutout portion formed therein for accommodating a patient's shoulders;

the cutout portion contains no shims;

shims of said shimset outside the at least one cutout portion are adapted to compensate for absence of shims in the cutout portion; and the shimset and the gradient coil are constructed so as not to have axial and azimuthal symmetry.

6. A system according to claim 5, wherein the shimset and the gradient coil each have two cutout portions which are diametrically opposite each other, the cutout portions of the gradient coil being aligned with the cutout portions of the shimset.

7. A shimset for a magnetic resonance imaging system wherein:

the shimset is axially and radially nonuniform;

the shimset includes at least one cutout portion formed therein for accommodating a patient's shoulders;

the cutout portion contains no shims; and shims of said shimset outside the at least one cutout portion are adapted to compensate for absence of shims in the cutout portion.

8. A magnetic resonance imaging system comprising a magnet for generating a main magnetic field, a shimset for homogenizing the main magnetic field, a gradient coil for superimposing a linearly varying magnetic field over the main magnetic field, and an RF coil forming part of a transmit/receive system for signals which are used to construct an image, wherein:

the shimset is axially and radially asymmetric;

the shimset includes at least one cutout portion formed therein for accommodating a patient's shoulders;

the cutout portion contains no shims;

shims of said shimset outside the at least one cutout portion are adapted to compensate for absence of shims in the cutout portion; and the shimset and the gradient coil are constructed so as not to have axial and azimuthal symmetry.

* * * * *